(12) United States Patent
Jung et al.

(10) Patent No.: US 12,464,897 B2
(45) Date of Patent: Nov. 4, 2025

(54) DISPLAY DEVICE AND METHOD OF MANUFACTURING SAME

(71) Applicant: LG Display Co., Ltd., Seoul (KR)

(72) Inventors: Deuksoo Jung, Paju-si (KR); Woojung Byun, Paju-si (KR); Minchan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 715 days.

(21) Appl. No.: 17/530,341

(22) Filed: Nov. 18, 2021

(65) Prior Publication Data
US 2022/0199714 A1   Jun. 23, 2022

(30) Foreign Application Priority Data
Dec. 22, 2020  (KR) .................. 10-2020-0180746

(51) Int. Cl.
| | | |
|---|---|---|
| *H10K 59/122* | (2023.01) | |
| *H10K 59/12* | (2023.01) | |
| *H10K 59/38* | (2023.01) | |
| *H10K 59/80* | (2023.01) | |
| *H10K 59/131* | (2023.01) | |

(52) U.S. Cl.
CPC .......... *H10K 59/122* (2023.02); *H10K 59/12* (2023.02); *H10K 59/38* (2023.02); *H10K 59/8051* (2023.02); *H10K 59/8792* (2023.02); *H10K 59/131* (2023.02); *H10K 59/80521* (2023.02)

(58) Field of Classification Search
CPC .... H10K 59/122; H10K 59/131; H10K 59/38; H10K 59/12; H10K 59/1201; H10K 59/8051; H10K 59/8792; H10K 59/1216; H10K 59/124; H10K 59/126; H10K 59/80521; H10K 71/861; H10K 2102/351; H10K 59/1213; H10K 59/351; G09G 3/3225
See application file for complete search history.

(56) References Cited

U.S. PATENT DOCUMENTS

| | | | |
|---|---|---|---|
| 10,644,086 B2 | 5/2020 | Kim et al. | |
| 10,811,624 B2 * | 10/2020 | Choi | ........... H10K 59/123 |
| 11,627,690 B2 * | 4/2023 | Jo | ............. H10K 59/1216 |
| | | | 257/40 |

(Continued)

FOREIGN PATENT DOCUMENTS

| KR | 20160092183 A | 8/2016 |
|---|---|---|
| KR | 20170115640 A | 10/2017 |

(Continued)

OTHER PUBLICATIONS

European Office Action for European Application No. 21 208 576.5, dated Feb. 19, 2025, 5 pages.

*Primary Examiner* — Mohammed Shamsuzzaman
(74) *Attorney, Agent, or Firm* — Seed Intellectual Property Law Group LLP

(57) ABSTRACT

A display device includes a substrate, a circuit element layer and a bank region. The substrate includes a light emitting region and a non-light-emitting region. The light emitting region forms an opening region. The non-light-emitting region is adjacent to the light emitting region. The circuit element layer is formed in the non-light-emitting region. The bank layer covers a top of the circuit element layer. The bank layer is not formed in the light emitting region.

12 Claims, 8 Drawing Sheets

(56) References Cited

U.S. PATENT DOCUMENTS

| | | | |
|---|---|---|---|
| 2011/0310069 A1* | 12/2011 | Sagawa | H10K 59/1213 |
| | | | 257/E33.001 |
| 2017/0317155 A1* | 11/2017 | Oh | H10D 86/60 |
| 2018/0026227 A1* | 1/2018 | Kim | H10K 59/131 |
| | | | 257/40 |
| 2018/0033851 A1* | 2/2018 | Kim | H10K 59/122 |
| 2018/0062105 A1* | 3/2018 | Lius | H10D 86/471 |
| 2018/0190738 A1 | 7/2018 | Park et al. | |
| 2019/0074466 A1* | 3/2019 | Choi | G09G 3/3233 |
| 2019/0165065 A1* | 5/2019 | Kong | H10K 59/38 |
| 2019/0172893 A1* | 6/2019 | Lee | H10K 59/131 |
| 2019/0235330 A1* | 8/2019 | Park | H01L 29/78633 |
| 2020/0119126 A1 | 4/2020 | Jo et al. | |
| 2021/0043873 A1* | 2/2021 | Sung | H10K 50/865 |
| 2021/0126075 A1* | 4/2021 | Wang | H10K 59/1213 |
| 2021/0202589 A1* | 7/2021 | Jo | H10K 59/131 |
| 2021/0202661 A1* | 7/2021 | Kim | H10K 59/126 |
| 2021/0202674 A1* | 7/2021 | Jo | H10K 71/00 |
| 2022/0085334 A1* | 3/2022 | Oh | H10K 59/871 |

FOREIGN PATENT DOCUMENTS

| | | | |
|---|---|---|---|
| KR | 10-1888941 B1 | 8/2018 | |
| KR | 10-2019-0026155 A | 3/2019 | |
| KR | 10-2019-0071336 A | 6/2019 | |
| KR | 20190064004 A | 6/2019 | |
| KR | 10-2019-0092655 A | 8/2019 | |
| TW | 201921676 A | 6/2019 | |
| WO | WO 2020172966 A1 | 9/2020 | |
| WO | WO-2022025395 A1 * | 2/2022 | H01L 25/0753 |

\* cited by examiner

DISPLAY DEVICE AND METHOD OF MANUFACTURING SAME

CROSS REFERENCE TO RELATED APPLICATION

The present application claims priority to Korean Patent Application No. 10-2020-0180746, filed on Dec. 22, 2020, the entire contents of which is incorporated herein for all purposes by this reference.

BACKGROUND

Technical Field

The present disclosure relates to a display device and a method of manufacturing the display device.

Description of the Related Art

An organic light emitting element (hereinafter referred to as a light emitting element) is a type of self-illuminating element and does not require a separate light source, thereby reducing the thickness and weight of a display device. In addition, features of the organic light emitting display device include low power consumption, high luminance, high responsiveness, and the like.

Typically, the light emitting element has a structure where an anode electrode, a bank surrounding an edge region of the anode electrode, a light emitting layer formed on top of the anode electrode within the bank, and a cathode electrode covering the light emitting layer and the bank are stacked on top of each other.

When the bank and the cathode electrode are arranged in an overlapping manner, a light-escaping phenomenon occurs where light is reflected inside and escapes into an adjacent pixel region, thereby causing user inconvenience.

The foregoing is intended merely to aid in the understanding of the background of the present disclosure, and is not intended to mean that the present disclosure falls within the purview of the related art that is already known to those skilled in the art.

BRIEF SUMMARY

A technical feature of embodiments is to provide a display device with a half-bank structure where a bank is omitted from a light emitting region in order to prevent a light-escaping phenomenon between pixels.

Another technical feature of embodiments is to provide a display device with a half-bank structure, the device having an anode electrode and a data wiring line made not to overlap and thus reducing light loss in a non-light-emitting region, thereby increasing light efficiency.

According to an embodiment, there is provided a display device including a substrate, a circuit element layer, and a bank layer. The substrate includes: a light emitting region having an opening region; and a non-light-emitting region adjacent to the light emitting region. The circuit element layer is formed in the non-light-emitting region. The bank layer covers a top of the circuit element layer, and is not formed in the light emitting region.

In the display device, the circuit element layer may include: a first conductive layer arranged on top of the substrate; a buffer layer covering the first conductive layer; an active layer arranged on top of the buffer layer; a gate insulating layer covering the active layer; and a second conductive layer being arranged on top of the gate insulating layer and including at least one electrode of a transistor.

The display device may further include: a passivation layer arranged on top of the gate insulating layer; and an overcoat layer arranged on top of the passivation layer, wherein the passivation layer and the overcoat layer are formed on all regions of the substrate, the all regions including the light emitting region and the non-light-emitting region.

The display device may further include: an anode electrode arranged on top of the overcoat layer; a light emitting layer arranged on top of the anode electrode; and a cathode electrode arranged on top of the light emitting layer, wherein the bank layer may be interposed between the anode electrode and the light emitting layer.

The display device may further include: a data line and a sensing line that extend in a direction of pixels arranged in columns, the pixels, in operation, displaying a white, red, green, or blue color, wherein the data line or the sensing line is arranged between the columns in which the pixels are arranged.

In the display device, the anode electrode may not overlap the data line or the sensing line.

The display device may further include a color filter having the red, green, or blue color, wherein the color filter may be arranged in the light emitting region and may be interposed between the passivation layer and the overcoat layer.

In the display device, the at least one transistor may include a drive transistor configured to control an amount of electric current flowing to the anode electrode, and the drive transistor may include a source electrode being arranged on the second conductive layer and being electrically connected to a power line; a gate electrode being included in the second conductive layer and being electrically connected to a lower electrode of a storage capacitor; and a drain electrode being arranged on the second conductive layer and being electrically connected to an upper electrode of the storage capacitor.

In the display device, the passivation layer may be interposed between the lower electrode of the storage capacitor and the upper electrode thereof.

In the display device, the bank layer may be realized in a stripe pattern in the display device.

The embodiments can be realized with a half-bank structure preventing a light-escaping phenomenon due to the light emitting with the light emitting element in the light emitting region.

In addition, the embodiments can increase the light efficiency by not making the anode electrode and the data wiring line overlap in the half-bank structure.

BRIEF DESCRIPTION OF THE SEVERAL VIEWS OF THE DRAWINGS

The above and other technical features and other advantages of the present disclosure will be more clearly understood from the following detailed description when taken in conjunction with the accompanying drawings, in which.

DETAILED DESCRIPTION

Figure 1:
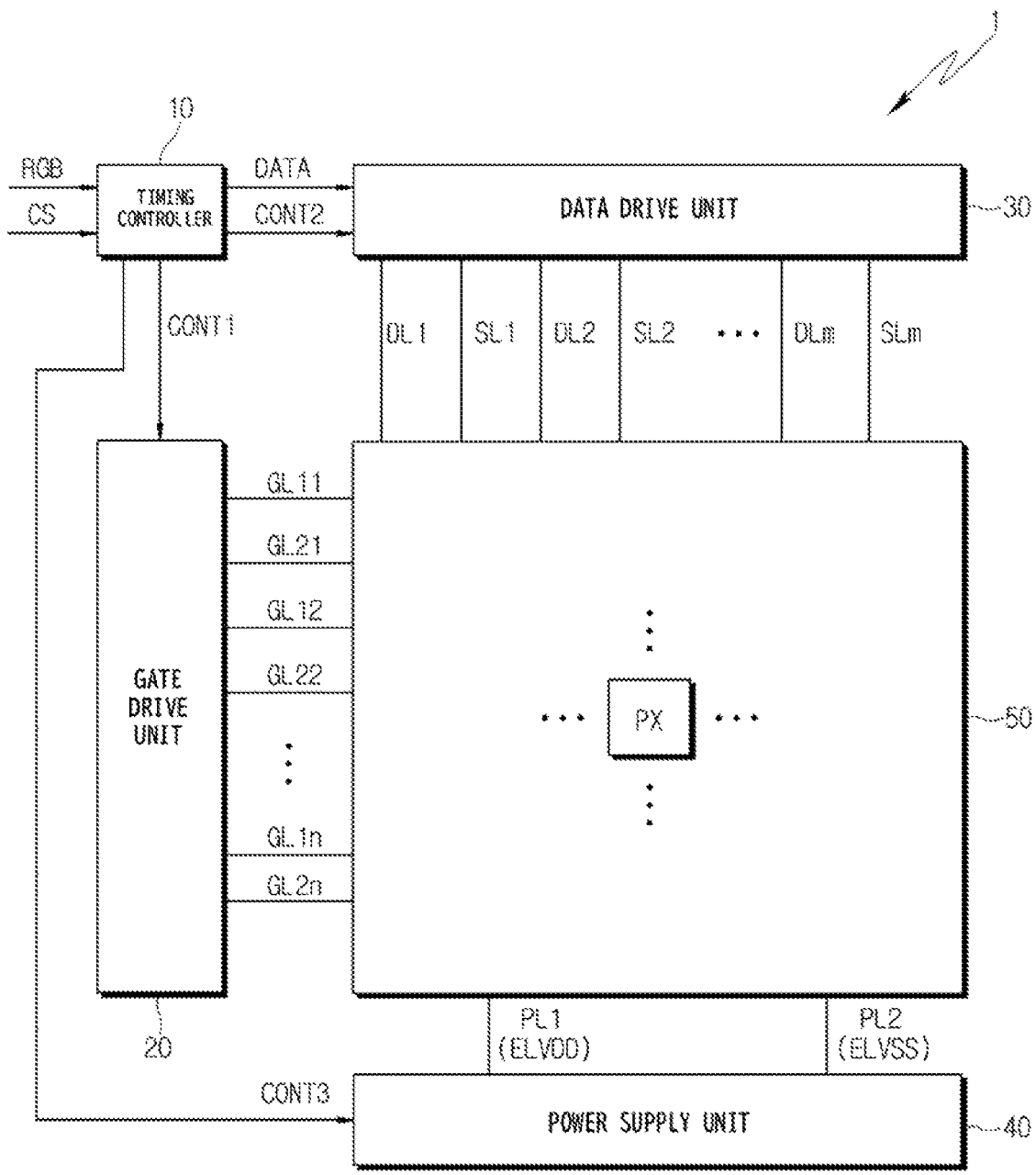
FIG. 1 is a block diagram illustrating a configuration of a display device according to an embodiment.

Embodiments will be described below with reference to the drawings. Throughout the present specification, in a case where a constituent element (or a region, a layer, a portion, or the like) is described as being "present on," "connected to," or "combined with" a different constituent element, this means that a constituent element may be connected/combined directly to/with a different constituent element or that a third constituent element may be arranged therebetween.

The same reference numeral refers to the same constituent element. In addition, for effective description of the technical contents, thicknesses, ratios, and dimensions of constituent elements are expressed in an exaggerated manner in the drawings. The phrase "and/or" is used to include one or more combinations that may be defined by relevant constituents.

The terms first, second, and so on may be used to describe various constituent elements but should not impose any limitation on the meanings thereof. These terms are used to distinguish one constituent element from another. For example, a first constituent element may be named a second constituent element without departing from the scope of the disclosure. Similarly, the second constituent element may be named the first constituent element. The indefinite article "a/an" is used to mean one or more, not only one, except as distinctively expressed in context.

The terms, "under," "below," "over," "above" and so on are used to describe a physical relationship between constituent elements that are illustrated in the drawings. These terms have the relative conceptual meaning and are used with reference to directions indicated in the drawings.

It should be understood that the terms "include," "have," and the like are intended to indicate that a feature, a number, a step, an operation, a constituent element, a component, or a combination of these, which is described in the present specification, is present. Therefore, it should be understood that the terms do not negate in advance the likelihood that one or more other features, numbers, steps, operations, constituent elements, components, or combinations of these will be present and added.

FIG. 1 is a block diagram illustrating a configuration of a display device according to an embodiment.

With reference to FIG. 1, a display device 1 includes a timing controller 10, a gate drive unit 20, a data drive unit 30, a power supply unit 40, and a display panel 50. The timing controller 10 may include timing controller circuitry 10, and may be referred to as timing controller circuitry 10. The gate drive unit 20 may include gate drive circuitry 20, and may be referred to as gate drive circuitry 20. The data drive unit 30 may include data drive circuitry 30, and may be referred to as data drive circuitry 30. The power supply unit 40 may include power supply circuitry 40, and may be referred to as power supply circuitry 40.

The timing controller 10 may receive an image signal RGB and a control signal CS from the outside. The image signal RGB may include a plurality of pieces of gradation data. The control signal CS, for example, may include a horizontal synchronization signal, a vertical synchronization signal, and a main clock signal.

The timing controller 10 may process the image signal RGB and the control signal CS in such a manner as to be suitable for a condition for operating the display panel 50 and may generate and output an image data DATA, a gate drive control signal CONT1, a data drive control signal CONT2, and a power supply control signal CONT3.

The gate drive unit 20 may be electrically connected to pixels PXs (or sub-pixels) of the display panel 50 through a plurality of the first gate lines GL11 to GL1$n$. The gate drive unit 20 may generate gate signals on the basis of the gate drive control signal CONT1 that is output from the timing controller 10. The gate drive unit 20 may provide the generated gate signals to the pixels PXs through the plurality of the first gate lines GL11 to GL1$n$. An individual pixel (or sub-pixel) is labeled in FIG. 1 as "PX," and one or more of the pixels may be collectively referred to as "pixels PXs" throughout the description.

In various embodiments, the gate drive unit 20 may be further electrically connected to the pixels PXs of the display panel 50 through a plurality of second gate lines GL21 to GL2$n$. The gate drive unit 20 may provide a sensing signal to the pixels PXs through the plurality of the second gate lines GL21 to GL2$n$. The sensing signal may be supplied to measure features of a drive transistor and/or a light emitting element that are provided within each of the pixels PXs.

The data drive unit 30 may be electrically connected to the pixels PXs of the display panel 50 through a plurality of data lines DL1 to DL$m$. The data drive unit 30 may generate data signals on the basis of the image data DATA and the data drive control signal CONT2 that are output from the timing controller 10. The data drive unit 30 may provide the generated data signals to the pixels PXs through the plurality of data lines DL1 to DL$m$.

In various embodiments, the data drive unit 30 may be further electrically connected to the pixels PXs of the display panel 50 through a plurality of sensing lines (or reference lines) SL1 to SL$m$. The data drive unit 30 may provide a reference voltage (or a sensing voltage or an initialization voltage) to the pixels PXs through the plurality of sensing lines SL1 to SL$m$ or may sense states of the pixels PXs on the basis of an electric signal fed back from the pixels PXs.

A power supply unit 40 may be electrically connected to the pixels PXs of the display panel 50 through a plurality of power lines PL1 and PL2. The power supply unit 40 may generate a drive voltage to be provided to the display panel 50 on the basis of the power supply control signal CONT3. The drive voltage, for example, may include a high-electric-potential drive voltage ELVDD and a low-electric-potential drive voltage ELVSS. The power supply unit 40 may provide the generated drive voltages ELVDD and ELVSS to the pixels PXs through the corresponding power lines PL1 and PL2, respectively.

The plurality of pixels PXs (or referred to as "sub-pixels") are arranged in the display panel 50. The pixels PXs, for example, may be arranged in matrix form on top of the display panel 50.

Each of the pixels PXs may be electrically connected to a corresponding gate line and data line. The pixels PXs may emit light at a luminance corresponding to the gate signal and the data signal that are supplied through the first gate lines GL11 to GL1$n$ and the data lines DL1 to Dl$m$, respectively.

Each of the pixels PXs may display one of first to third colors. In an embodiment, each of the pixels PXs may display one of red, green, and blue colors. In another embodiment, each of the pixels PXs may display one of cyan, magenta, and yellow. In various embodiments, each of the pixels PXs may be configured to display one of four or more colors. For example, each of the pixels PXs may display one of red, green, blue, and white colors.

The timing controller 10, the gate drive unit 20, the data drive unit 30, and the power supply unit 40 may be configured as separate integrated circuits (IC), or at least one of these constituent elements may be configured to be integrated, as an integrated circuit, with one or more other constituent components. For example, at least one of the data drive unit 30 and the power supply unit 40 may be configured to be integrated, as an integrated circuit, with the timing controller 10.

In addition, in FIG. 1, the gate drive unit 20 and the data drive unit 30 are illustrated as constituent elements separated from the display panel 50. However, at least one of the gate drive unit 20 and the data drive unit 30 may be configured in such a manner as to be formed integrally with the display panel 50 using an in-panel method. For example, the gate drive unit 20 may be formed integrally with the display panel 50 using a gate-in-panel (GIP) method.

Figure 2:
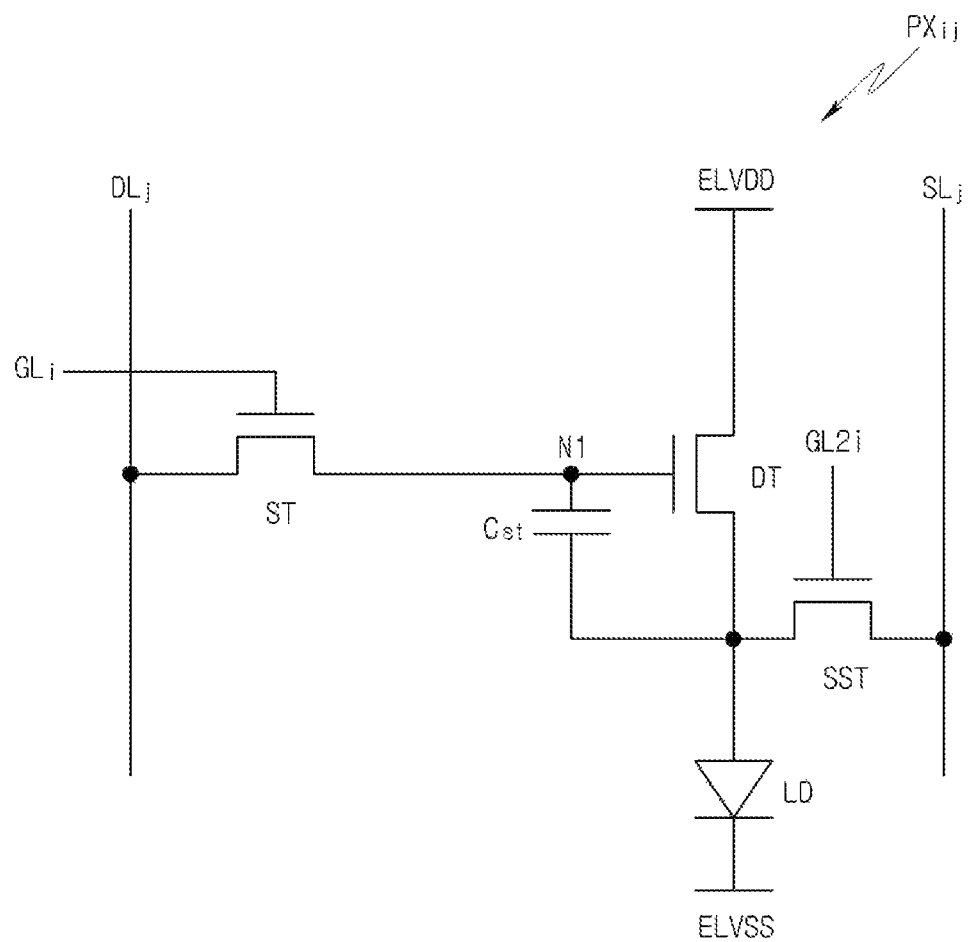
FIG. 2 is a view illustrating a circuit of an embodiment of a pixel illustrated in FIG. 1.

FIG. 2 is a view illustrating a circuit of an embodiment of the pixel illustrated in FIG. 1. FIG. 2 illustrates a pixel Pxij, as an example, that is electrically connected to an i-th first gate line GL1i and a j-th data line DLj.

With reference to FIG. 2, the pixel Pxij includes a switching transistor ST, a drive transistor DT, a sensing transistor SST, a storage capacitor Cst, and light emitting element LD.

A first electrode (for example, a source electrode) of the switching transistor ST is electrically connected to the j-th data line Dlj, and a second electrode (for example, a drain electrode) is electrically connected to the first node N1. A gate electrode of the switching transistor ST is electrically connected to the i-th first gate line GL1i. When the gate signal at a gate-on level is applied to the i-th first gate line Gl1i, the switching transistor ST is turned on, and thus the data signal applied to the j-th data line Dlj is transferred to the first node N1.

The first electrode of a storage capacitor Cst is electrically connected to the first node N1, and the second electrode is configured in such a manner as to be supplied with the high-electric-potential drive voltage ELVDD. The storage capacitor Cst may be charged with a voltage corresponding to a difference between a voltage applied to the first node N1 and the high-electric-potential drive voltage ELVDD.

A first electrode (for example, a source electrode) of the drive transistor DT is configured to be supplied with the high-electric-potential drive voltage ELVDD, and a second electrode (for example, a drain electrode) is electrically connected to the first electrode (for example, an anode electrode) of the light emitting element LD. A gate electrode of the drive transistor DT is electrically connected to the first node N1. When a voltage at the gate-on level is applied through the first node N1, the drive transistor DT is turned on, and thus an amount of drive electric current that flows through the light emitting element LD in a manner that corresponds to a voltage provided to the gate electrode, that is, a voltage stored in the storage capacitor Cst may be controlled.

The first electrode (for example, a source electrode) of the sensing transistor SST is electrically connected to a j-th sensing line Slj, and the second electrode (for example, a drain electrode) is electrically connected to the first electrode (for example, the anode electrode) of the light emitting element LD. A gate electrode of the sensing transistor SST is electrically connected to an i-th second gate line GL2i. When the sensing signal at the gate-on level is applied to the i-th second gate line GL2i, the sensing transistor SST is turned on, and thus the reference voltage applied to the j-th sensing line Slj is transferred to the anode electrode of the light emitting element LD.

The light emitting element LD outputs light corresponding to the drive electric current. The light emitting element LD may output light corresponding to one of white, red, green, and blue colors. The light emitting element LD may be an organic light emitting diode (OLED) or a microscopic inorganic light emitting diode with a micro- to nano-scale size, and the present disclosure is not limited to these diodes. Embodiments that result when the light emitting element LD is configured with the organic light emitting diode will be described below.

A structure of each of the pixels PXs according to the present disclosure is not limited to that illustrated in FIG. 2. In an embodiment, the pixels PXs may further include at least one element for compensating for a threshold voltage of the drive transistor DT or initializing a voltage of the gate electrode of the drive transistor DT and/or a voltage of the anode electrode of the light emitting element LD.

An example where the switching transistor ST, the drive transistor DT, and the sensing transistor SST are NMOS transistors is illustrated in FIG. 2, but the present disclosure is not limited to this example. For example, at least one of transistors constituting each of the pixels PXs may be configured with PMOS transistors. In various embodiments, each of the switching transistor ST, the drive transistor DT, and the sensing transistor SST may be realized as a low temperature polysilicon (LTPS) thin film transistor, an oxide thin film transistor, or a low temperature polycrystalline oxide (LTPO) thin film transistor.

Figure 3A:
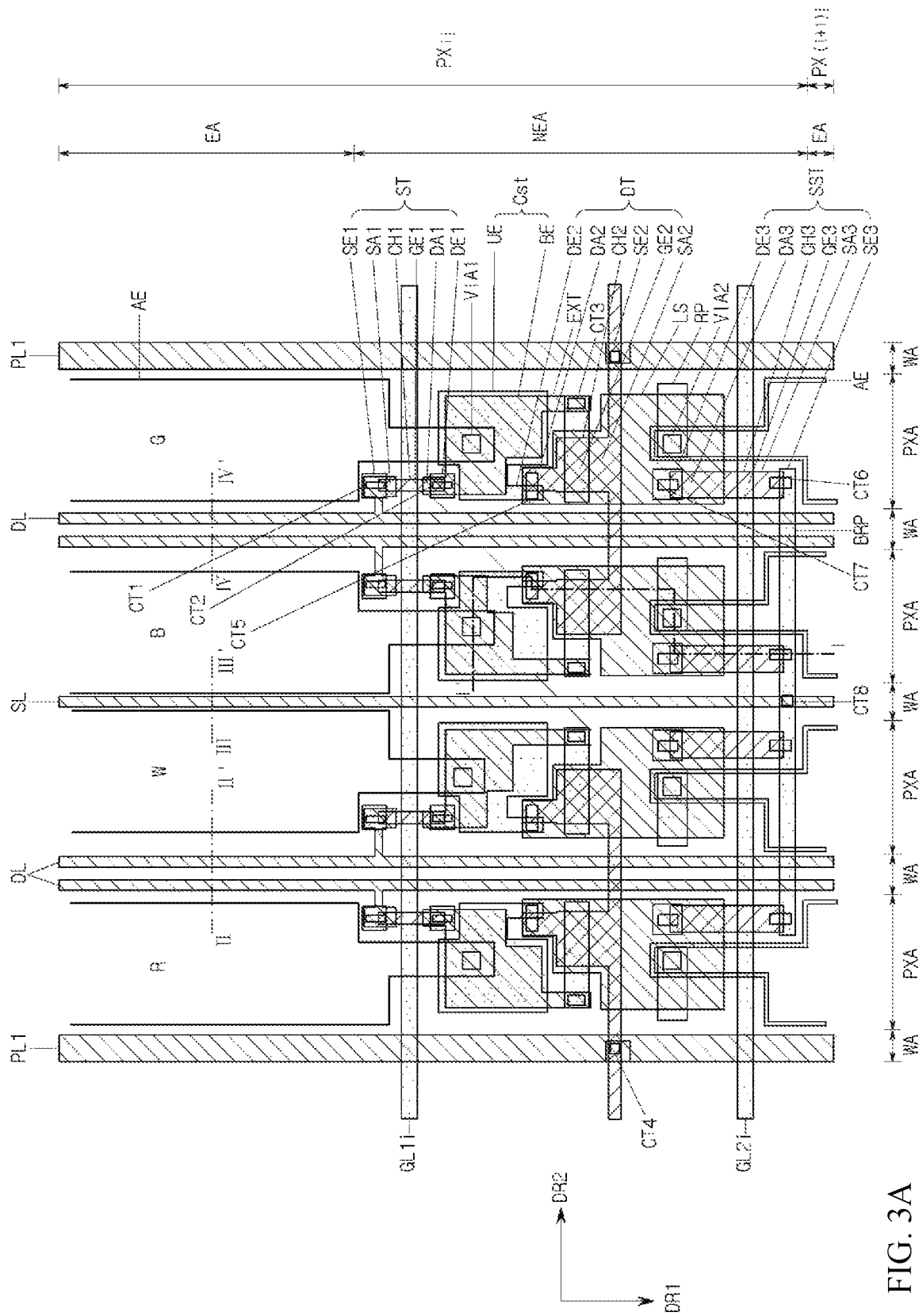
FIGS. 3A and 3B are views each illustrating a planar layout of a pixel according to an embodiment.
Figure 3B:
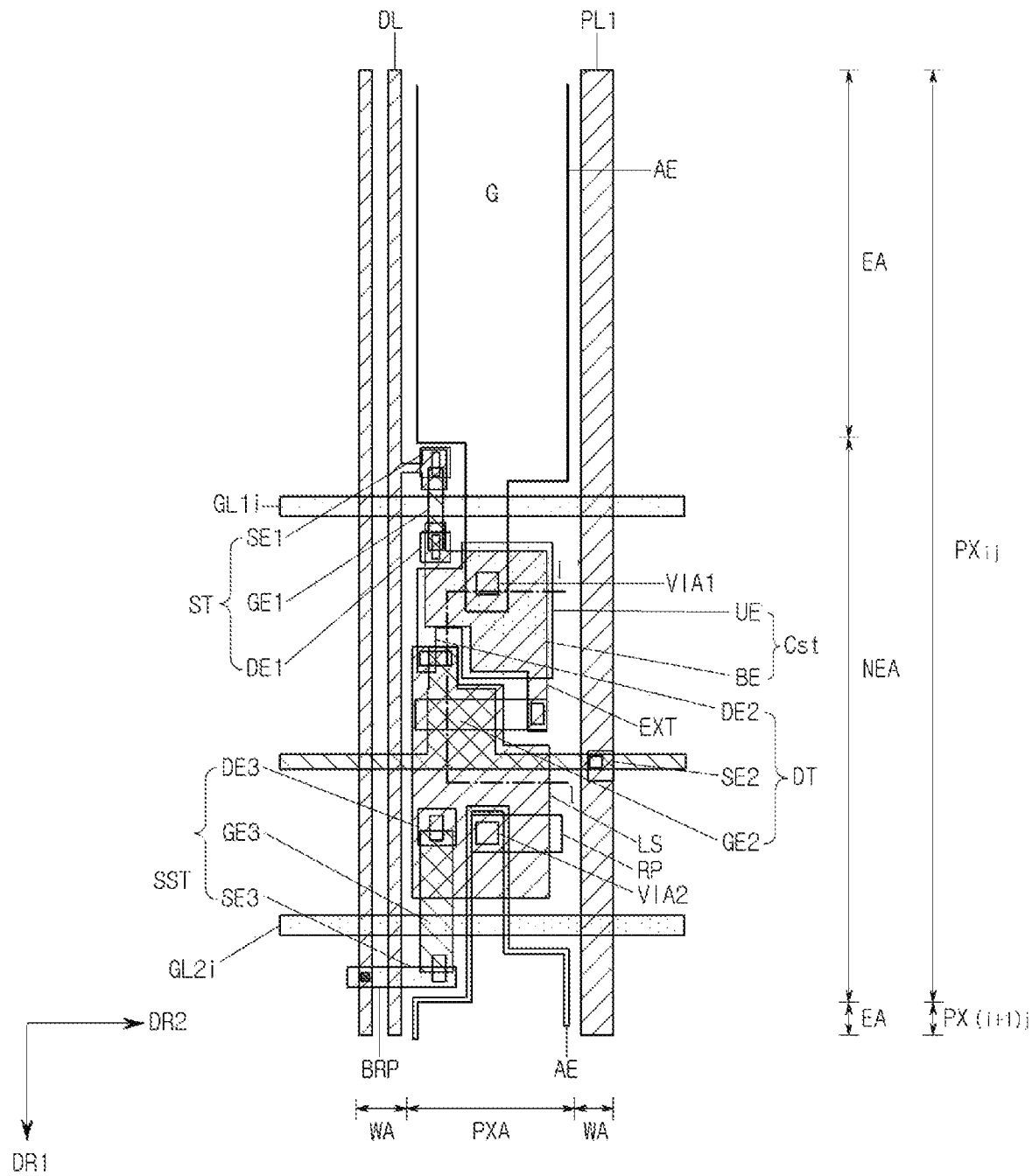

FIGS. 3A and 3B are views each illustrating a planar layout of the pixel according to an embodiment.

With reference to FIGS. 3A to 3B, together with FIG. 2, the display panel 50 includes pixel regions PXAs. The pixel regions PXAs are defined by regions where data lines DL extending in a first direction DR1 (for example, a pixel column direction) and the first and second gate lines GL1 and GL2 extending in a second direction DR2 (for example, a pixel row direction) intersect each other. The pixels PXs are arranged in the pixel regions PXAs, respectively. In FIGS. 3A and 3B, individual pixel regions may be labaled "PXA," and a group of one or more pixel regions may be referred to collectively as "pixel regions PXAs" throughout the description.

Each of the pixel regions PXAs may include a light emitting region EA and a non-light-emitting region NEA. The light emitting element LD of the pixel PX is arranged in the light emitting region EA. Circuit elements (for example, the switching transistor ST, the drive transistor DT, the sensing transistor SST, and the storage capacitor Cst) for driving the light emitting element LD are arranged in the non-light-emitting region NEA. The light emitting element LD may be driven by the circuit elements arranged in the non-light-emitting region NEA and may emit light in a specific color. The pixel region PXA may include an opening region transmitting light of the light emitting element LD and displaying an image to the outside. The opening region may be formed in a manner that corresponds to the pixel PX displaying one of red, green, blue and white colors.

The wiring line regions WAs may be defined between pixel columns. The data line DL and the sensing line SL that extend in the first direction DR1 are arranged in each of the wiring line regions WAs. The data signal from the data drive unit 30 may be applied to the data line DL. The reference voltage from the data drive unit 30 may be applied to the sensing line SL, or the sensing line SL may transfer the electric signal, output from the corresponding pixel PX, to the data drive unit 30. Individual wiring line regions may be labeled as "WA" in FIGS. 3A and 3B, and a group of one or more wiring line regions may be referred to collectively throughout the description as "wiring line regions WAs."

In an embodiment, a first power line PL1 may be further formed in one or several of the wiring line regions WAs. The first power line PL1 serves to apply the high-electric-potential drive voltage ELVDD to the pixels PXs. The first power line PL1 may extend in the first direction DR1 in a manner that is approximately in parallel to the data line DL and the sensing line SL.

The first gate line GL1 and the second gate line GL2 extends across the non-light-emitting region NEA in the second direction DR2. In this case, the first gate line GL1 and the second gate line GL2 may be arranged a predetermined distance or selected distance apart along the first direction DR1.

The data line DL, the sensing line SL, the first power line PL1, the first gate line GL1, and the second gate line GL2 may be electrically connected to the circuit elements through contact holes. Specifically, the data line DL may be electrically connected to one electrode (for example, the source electrode) of the switching transistor ST, and the sensing line SL may be electrically connected to one electrode (for example, the source electrode) of the sensing transistor SST. The first gate line GL1 is electrically connected to the gate electrode of the switching transistor ST, and the second gate line GL2 is electrically connected to the gate electrode of the sensing transistor SST.

The pixel PX, as described with reference to FIG. 2, may include the switching transistor ST, the drive transistor DT, the sensing transistor SST, the storage capacitor Cst, and the light emitting element LD.

The switching transistor ST may include a first gate electrode GE1, a first source electrode SE1, and a first drain electrode DE1.

The first gate electrode GE1 may be arranged in a manner that overlaps a first channel CH1 formed in the active layer ACT. The first channel CH1 may be a semiconductor pattern within the active layer ACT, the semiconductor pattern being not doped with impurities. The first gate electrode GE1 may be electrically connected to the first gate line GL1. For example, the first gate electrode GE1 may be one region that overlaps the first channel CH1 in the first gate line GL1.

The first source electrode SE1 may be connected to a first source region SA1 formed on one side of the first channel CH1 of the active layer ACT. The first source electrode SE1 may be further connected to the data line DL through the first contact hole CT1.

The first drain electrode DE1 may be connected to a first drain region DA1 formed on the other side of the first channel CH1 of the active layer ACT. The first drain electrode DE1 may be electrically connected to a lower electrode BE of the storage capacitor Cst through a second contact hole CT2.

The drive transistor DT may include a second gate electrode GE2, a second source electrode SE2, and a second drain electrode DE2.

The second gate electrode GE2 may be arranged in a manner that overlaps a second channel CH2 formed in the active layer ACT. The second gate electrode GE2 may be electrically connected to the lower electrode BE of the storage capacitor Cst through the third contact hole CT3.

The second source electrode SE2 may be connected to a second source region SA2 formed on one side of the second channel CH2 of the active layer ACT. The second source electrode SE2 may be electrically connected, through the fourth contact hole CT4, to the first power line PL1 to which the high-electric-potential drive voltage ELVDD is applied. In this embodiment, the second source electrode SE2 may be configured as substantially a conductive pattern provided on the wiring line region WA.

The second drain electrode DE2 may be connected to a second drain region DA2 formed on the other side of the second channel CH2 of the active layer ACT. The second drain electrode DE2 may be electrically connected to an upper electrode UE through the storage capacitor Cst. For example, the second drain electrode DE2 may be formed integrally with the upper electrode UE of the storage capacitor Cst and thus may constitute one pattern. As described below, an upper electrode UE2 of the storage capacitor Cst is connected to an anode electrode AE of the light emitting element LD through a first via hole VIA1. Therefore, the second drain electrode DE2 of the drive transistor DT is electrically connected to the anode electrode AE of the light emitting element LD by way of the upper electrode UE of the storage capacitor Cst.

In addition, the second drain electrode DE2 may be connected to the light blocking layer LS through a fifth contact hole CT5. Accordingly, when a defective pixel PX is repaired using a repair pattern RP, the repair pattern RP and the light blocking layer LS are connected to each other through laser welding, and thus the anode electrode AE of the adjacent pixel Px(i+1)j and the second drain electrode DE2 of the drive transistor DT can be electrically connected to each other.

The sensing transistor SST may include a third gate electrode GE3, a third source electrode SE3, and a third drain electrode DE3.

The third gate electrode GE3 may be arranged in a manner that overlaps a third channel CH3 formed in the active layer ACT. The third gate electrode GE3 may be electrically connected to the second gate line GL2. For example, the third gate electrode GE3 may be one region that overlaps the third channel CH3 in the second gate line GL2.

The third source electrode SE3 may be connected to a third source region SA3 formed on one side of the third channel CH3 of the active layer ACT. The third source electrode SE3 may be electrically connected to a bridge pattern BRP through a sixth contact hole CT6. The bridge pattern BRP is electrically connected to the sensing line SL through an 8-eighth contact hole CT8. Therefore, the third source electrode SE3 may be connected to the sensing line SL by way of the bridge pattern BRP.

The third drain electrode DE3 may be connected to a third drain region DA3 formed on the other side of the third channel CH3 of the active layer ACT. In addition, the third drain electrode DE3 may be connected to the light blocking layer LS through a seventh contact hole CT7. According to the present embodiment, the light blocking layer LS is connected to the second drain electrode DE2 of the drive transistor DT through the fifth contact hole CT5. Therefore, the third drain electrode DE3 is electrically connected to the second drain electrode DE2 of the drive transistor DT by way of the light blocking layer LS.

The storage capacitor Cst may include the lower electrode BE and the upper electrode UE.

The lower electrode BE may be electrically connected to the first drain electrode DE1 of the switching transistor ST through the second contact hole CT2. In addition, the lower electrode BE may be electrically connected to the second gate electrode GE2 of the drive transistor DT through the third contact hole CT3.

In an embodiment, the lower electrode BE may include the extension portion EXT used for connection to the second gate electrode GE2 of the drive transistor DT. The lower electrode BE overlaps the second gate electrode GE2 in one region of the extension portion EXT and is electrically connected to the second gate electrode GE2 through the third contact hole CT3.

At least one region of the upper electrode UE is formed in such a manner as to cover the lower electrode BE. Electric potential corresponding to a difference in electric potential between opposite electrodes may be stored between the upper electrode UE and the lower electrode BE, and thus the upper electrode UE and the lower electrode BE may operate as the storage capacitor Cst.

Respective overlapping areas of the upper electrode UE and the lower electrode BE may determine a capacity of the storage capacitor Cst. Therefore, the upper electrode UE and the lower electrode BE may have an area (magnitude) for satisfying a capacity beneficial in the storage capacitor Cst.

The upper electrode UE may be electrically connected to the second drain electrode DE2 of the drive transistor DT through the fifth contact hole CT5. In addition, the upper electrode UE may be electrically connected to the anode electrode AE of the light emitting element LD through the first via hole VIA1.

The storage capacitor Cst as described above is connected to the second gate electrode GE2 of the drive transistor DT through the lower electrode BE. A cathode electrode CE of the light emitting element LD, which will be described below, may be formed on top of the drive transistor DT. In this case, an electric field may be formed between the second gate electrode GE2 of the drive transistor DT and the cathode electrode CE, and thus a charging rate of the storage capacitor Cst electrically connected to the second gate electrode GE2 may be decreased. In other words, a parasite capacitor of which one electrode is the second gate electrode GE2 and of which the other electrode is the cathode electrode CE may be formed. According to the present embodiment, in a case where the second gate electrode GE2 is electrically connected to the lower electrode BE, instead of the upper electrode UE of the storage capacitor Cst, an electrical path from the parasite capacitor to the storage capacitor Cst is relatively remotely positioned, and thus an influence of the parasite capacity can be decreased. In addition, the lower electrode BE of the storage capacitor Cst is formed on top of the substrate of the display panel 50. Therefore, an electric field can be prevented from being formed between the second gate electrode GE2 and the cathode electrode CE, and thus the parasitic capacitor can be removed.

The light emitting element LD may include the anode electrode AE, the cathode electrode CE, and a light emitting layer EML arranged between the anode electrode AE and the cathode electrode CE. In an embodiment, the anode electrode AE, the light emitting layer EML, and the cathode electrode CE may be arranged in such a manner as to be brought into direct contact with each other in the light emitting region EA.

The anode electrode AE may be connected to the upper electrode UE of the storage capacitor Cst through the first via hole VIA1. In the non-light-emitting region NEA that will be described below, a bank layer BNK, the light emitting layer EML, and the cathode electrode CE may be arranged on top of the anode electrode AE. In most cases, the anode electrode AE is formed in the light emitting region EA. However, at least one region of the anode electrode AE may extend up to the non-light-emitting region NEA in order for the anode electrode AE to be brought into contact with the upper electrode UE of the storage capacitor Cst.

The light emitting layer EML and the cathode electrode CE is widely formed in the light emitting region EA and the non-light-emitting region NEA, and in this case, the light emitting layer EML covers the anode electrode AE.

In an embodiment, the pixel PX may further include the repair pattern RP. One region of the repair pattern RP is arranged in such a manner as to overlap the light blocking layer LS instead of overlapping the anode electrode AE of the adjacent pixel PX(i+1)j.

In this case, the other region of the repair pattern RP is electrically connected to the anode electrode AE of the adjacent Px(i+1)j through the second via hole VIA2. In order to be electrically connected to the anode electrode AE of the adjacent pixel Px(i+1)j, the repair pattern RP may be arranged close to the anode electrode AE of the adjacent pixel Px(i+1)j within the non-light-emitting region NEA.

Since the repair pattern RP is arranged close to the anode electrode AE of the adjacent pixel Px(i+1)j within the non-light-emitting region NEA, the light blocking layer LS arranged in a manner that overlaps the one region of the repair pattern RP may have an area that is widely expanded from a portion thereof overlapping the drive transistor DT up to the one region of the repair pattern RP.

The repair pattern RP as described above may be an electrode in the island shape that has approximately the form of a bar extending along the second direction DR2. However, the repair pattern RP is not limited to this shape, and the shape thereof may vary widely with a state where other constituent elements including the light blocking layer LS and the anode electrode AE are arranged relative to each other.

In FIGS. 3A and 3B, the display device 1 having as WRGB structure that includes a white pixel W is illustrated as an example. However, the above-described embodiments do not find application in only the display device 1 having the WRGB structure. That is, in the above-described embodiments, various features not related to the white pixel W may find application in display devices with an RGB structure or RGBG structure that does not include the white pixel W. In addition, in the above-described embodiments, various features related to the white pixel W may find application in display devices with various structures that includes the white pixel W, as well as the display device 1 with the WRGB structure.

A stacking structure (cross-sectional structure) of the pixel PX according to an embodiment will be described in more detail below with reference to the drawings.

Figure 4:
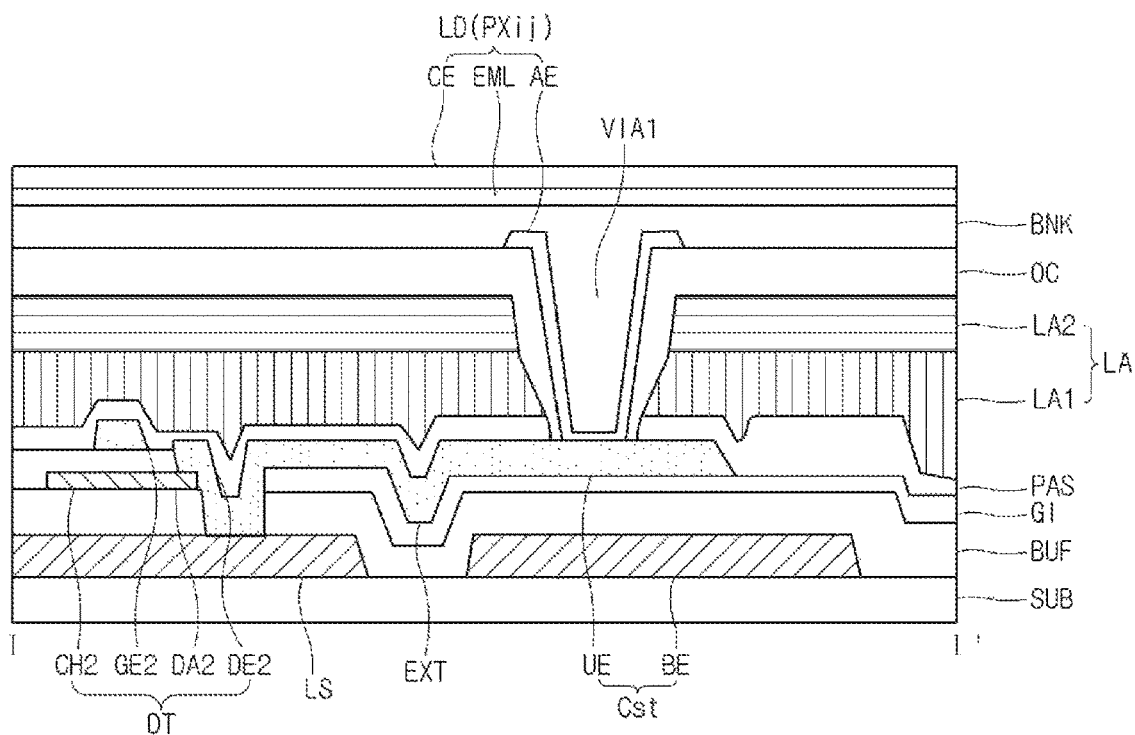
FIG. 4 is a cross-sectional view taken along line I-I' on FIG. 3B.

FIG. 4 is a cross-sectional view of a pixel according to an embodiment. Specifically, FIG. 4 is a cross-sectional view taken along line I-I' in FIG. 3B.

With reference to FIG. 4, together with FIGS. 3A and 3B, the display panel 50 may include a substrate SUB, a circuit element layer, and a light emitting element layer.

The substrate SUB serves as a base substrate of the display panel 50 and may be a transparent substrate. The substrate SUB may be a rigid substrate made of glass or tempered glass or may be a flexible substrate made of a plastic material. For example, the substrate SUB may be formed of a plastic material, such as polyimide, polyethylene terephthalate (PET), polyethylene naphthalate (PEN), or polycarbonate (PC). However, the substrate SUB is not limited to these materials.

The pixel region PXA is on top of the substrate SUB. The pixel region PXA may be a region including at least one circuit element arranged on the circuit element layer and the light emitting element LD arranged on the light emitting element layer. At least one circuit element and at least one light emitting element LD may constitute one pixel PX.

The circuit element layer may include circuit elements (for example, the switching transistor ST, the drive transistor DT, the sensing transistor SST, the storage capacitor Cst, and the like) that are formed on top of the substrate SUB and constitute the pixel PX, and wiring lines.

First, first conductive layer may be arranged on top of the substrate SUB. The first conductive layer may include the light blocking layer LS and the lower electrode BE of the storage capacitor Cst.

The light blocking layer LS may be arranged in such a manner as to overlap the semiconductor pattern of the drive transistor DT, particularly, a second channel CH2 in a plane and thus can protect an oxide semiconductor element from external light. In an embodiment, the light blocking layer LS may be further connected to the second drain electrode DE2 of the drive transistor DT through the fifth contact hole CT5. Accordingly, when the defective pixel PX is repaired using the repair pattern RP, the repair pattern RP and the light blocking layer LS are connected to each other using the laser welding, and thus the anode electrode AE of the adjacent pixel Px(i+1)j and the second drain electrode DE2 of the drive transistor DT can be electrically connected to each other.

The lower electrode BE may be electrically connected to the first drain electrode DE1 of the switching transistor ST through the second contact hole CT2. In addition, the lower electrode BE may be electrically connected to the second gate electrode GE2 of the drive transistor DT through the third contact hole CT3.

In an embodiment, the lower electrode BE may include the extension portion EXT used for connection to the second gate electrode GE2 of the drive transistor DT. The lower electrode BE overlaps the second gate electrode GE2 in one region of the extension portion EXT and is electrically connected to the second gate electrode GE2 through the third contact hole CT3. The other region of the extension portion EXT is arranged in such a manner as not to overlap the other electrodes of the circuit elements and the anode electrode AE of the light emitting element LD. Accordingly, when the second gate electrode GE2 and the anode electrode AE are thus electrically separated by cutting the extension portion EXT using a laser, and then when the defective pixel PX is repaired, an electric short circuit can be prevented from occurring between the other electrodes and/or between the anode electrode AE and the cathode electrode CE of the light emitting element LD.

The first conductive layer may further include the data line DL, the sensing line SL, and the first power line PL1 in the wiring line region WA. The data line DLj is connected to the first source electrode SE1 of the switching transistor ST through the first contact hole CT1. The sensing line SL is connected to the third source electrode SE3 of the sensing transistor SST by way of the bridge pattern BRP. The first power line PL1 is connected to the second source electrode SE2 of the drive transistor DT through the fourth contact hole CT4.

In various embodiments, wiring lines and/or electrodes that are not illustrated, for example, a second power line PL2 along which the low-electric-potential drive power ELVSS is applied, an auxiliary electrode, and the like may be further provided on top of the substrate SUB.

A buffer layer BUF is arranged on top of the substrate SUB in such a manner as to cover the light blocking layer LS, the lower electrode BE of the storage capacitor Cst, and the wiring lines. The buffer layer BUF may prevent ions and impurities from being diffused from the substrate SUB and may block water penetration. In addition, the buffer layer BUF can improve the surface flatness of the substrate SUB. The buffer layer BUF may contain an inorganic material, such as oxide or nitride, an organic material, or an organic or inorganic compound and may be formed in such a manner as to have a single-layered or multi-layered structure. For example, the buffer layer BUF may have a three-layered structure that has a silicon oxide layer, a silicon nitride layer, and a silicon oxide layer or may have a four-layered structure or more. In another embodiment, the buffer layer BUF may be omitted.

The active layer ACT may be formed on top of the buffer layer BUF. The active layer ACT may be formed of a silicon-based semiconductor material or an oxide-based semiconductor material. As the silicon-based semiconductor material, amorphous silicon or polycrystalline silicon may be used. As an oxide-based semiconductor material, a four elements-based metal oxide may be used, such as an indium tin gallium zinc oxide (InSnGaZnO). Furthermore, as the oxide-based semiconductor material, a three elements-based metal oxide may be used, such as an indium, gallium, zinc oxide (InGaZnO), an indium, tin, zinc oxide (InSnZnO), an indium aluminum, zinc oxide (InAlZnO), a tin gallium, zinc oxide (SnGaZnO), an aluminum, gallium, zinc oxide (AlGaZnO), or a tin aluminum zinc oxide (SnAlZnO). Furthermore, as the oxide-based semiconductor material, a two elements-based metal oxide may be used, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), or an indium gallium oxide (InGaO). Furthermore, as the oxide-based semiconductor material, an indium oxide (InO), a tin oxide (SnO), a zinc oxide (ZnO), or the like may be used.

The active layer ACT may include first to third source regions SA1 to SA3, first to third drain regions DA1 to DA3, and first to third channels CH1 to CH3. The first to third source regions SA1 to SA3 and the first to third drain regions DA to DA contain p-type or n-type impurities. The first channel CH1 is formed between the first source region SA1 and the first drain region DA1. The second channel CH2 is formed between the second source region SA2 and the second drain region DA2. The third channel CH3 is formed between the third source region SA3 and the third drain region DA3.

A second conductive layer is arranged on top of the active layer ACT. A gate insulating layer GI may be interposed between the active layer ACT and the second conductive layer. The gate insulating layer GI may be a silicon oxide (SiOx) layer, a silicon oxide (SiNx) layer, or a multi-layer made up of these layers.

The second conductive layer may include gate electrodes GE1, GE2, and GE3, source electrodes SE1, SE2, and SE3, and drain electrodes DE1, DE2, and DE3. The gate electrodes GE1, GE2, and GE3 may be arranged on tops of the corresponding channels CH1, CH2, and CH3, respectively, of the active layer ACT in an overlapping manner. At least one electrode, for example, the electrodes GE1 and GE3 of the gate electrodes GE1, GE2, and GE3 may be formed integrally with the wiring lines GL1 and GL2, respectively, that are electrically connected to the electrodes GE1 and GE3 and thus may constitute one pattern.

The second conductive layer may further include the upper electrode UE of the storage capacitor Cst. At least one region of the upper electrode UE is formed in such a manner as to cover the lower electrode BE. Electric potential corresponding to a difference in electric potential between opposite electrodes may be stored between the upper electrode UE and the lower electrode BE, and thus the upper electrode UE and the lower electrode BE may operate as the storage capacitor Cst.

The upper electrode UE may be electrically connected to the second drain electrode DE2 of the drive transistor DT through the fifth contact hole CT5. In addition, the upper electrode UE may be electrically connected to the anode electrode AE of the light emitting element LD through the first via hole VIA1.

The storage capacitor Cst as described above is connected to the second gate electrode GE2 of the drive transistor DT through the lower electrode BE. The cathode electrode CE of the light emitting element LD may be formed on top of the drive transistor DT. In this case, an electric field may be formed between the second gate electrode GE2 of the drive transistor DT and the cathode electrode CE, and thus the charging rate of the storage capacitor Cst electrically connected to the second gate electrode GE2 may be decreased. In other words, the parasite capacitor of which one electrode is the second gate electrode GE2 and of which the other electrode is the cathode electrode CE may be formed. According to the present embodiment, in the case where the second gate electrode GE2 is electrically connected to the lower electrode BE, instead of the upper electrode UE of the storage capacitor Cst, the electrical path from the parasite capacitor to the storage capacitor Cst is relatively remotely positioned, and thus the influence of the parasite capacity can be decreased. In addition, the lower electrode BE of the storage capacitor Cst is formed on top of the substrate of the display panel 50. Therefore, the electric field can be prevented from being formed between the second gate electrode GE2 and the cathode electrode CE, and thus the parasitic capacitor can be removed.

The second conductive layer may further include the bridge pattern BRP. The bridge pattern BRP may electrically connect the third source electrode SE3 of the sensing transistor SST and the sensing line SL to each other.

The second conductive layer may further include the repair pattern RP. One region of the repair pattern RP is arranged in such a manner as to overlap the light blocking layer LS instead of overlapping the anode electrode AE of the adjacent pixel PX(i+1)j. In this case, the other region of the repair pattern RP is electrically connected to the anode electrode AE of the adjacent Px(i+1)j through the second via hole VIA2.

The first and second conductive layers may be formed of one selected from a group consisting of molybdenum (Mo), aluminum (Al), chromium (Cr), gold (Au), titanium (Ti), nickel (Ni), neodymium (Nd), and copper (Cu) or may be formed of an alloy of these. In addition, the first and second conductive layers may be multi-layers each of which is formed of one selected from a group consisting of molybdenum (Mo), aluminum (Al), chromium (Cr), gold (Au), titanium (Ti), nickel (Ni), neodymium (Nd), and copper (Cu) or is formed of an alloy of these. For example, the first and second conductive layers may be double layers each of which is formed of molybdenum/aluminum-neodymium or molybdenum/aluminum.

The circuit element layer may be covered by the passivation layer PAS. The passivation layer PAS may cover the second conductive layer and respective exposed regions of the buffer layer BUF and the active layer ACT, the exposed regions not being covered by the second conductive layer. The passivation layer PAS serves as an insulating film for protecting elements below and may be a silicon oxide film (SiOx), a silicon nitride film, or a multi-layer made up of these films. In various embodiments, the passivation layer PAS may be omitted.

An overcoat layer OC may be formed on top of the passivation layer PAS. The overcoat layer OC may be a flattened film for reducing a height difference in a lower structure and may be formed of an organic material, such as polyimide, benzocyclobutene series resin, or acrylate. The passivation layer PAS and the overcoat layer OC may be formed on all regions of the substrate SUB. In one embodiment, the all regions includes the light emitting region EA and the non-light-emitting region NEA. It will be understood that "all regions" may refer to the light emitting region EA and the non-light-emitting region NEA while excluding other possible "regions" of the substrate SUB. For example, sidewalls, an underside or both of the substrate SUB may be excluded from "all regions," as the sidewalls and underside of the substrate SUB may be substantially free of the overcoat layer OC, the passivation layer PAS or both.

In an embodiment, a color filter (not illustrated) may be formed between the passivation layer PAS and the overcoat layer OC. The color filter may be formed in the light emitting region EA. The color filter is a wavelength-selective optical filter that selectively transmits incident light in substantially only one portion of a wavelength band by transmitting light in a specific wavelength band and blocking light in other one specific wavelength band, and may be formed of photosensitive resin including a colorant such as a pigment or a dye. Light passing through the color filter in the light emitting region EA may have one of red, green, and blue colors. In a case where a pixel PX displays a white color, a color filter for the corresponding pixel PX may be omitted.

The color filter is described above as being formed between the passivation layer PAS and the overcoat layer OC, but the present embodiment is not limited to this position. That is, in a case where the light emitting element LD is a type of front-surface light emitting, the color filter may be formed on an upper layer of the light emitting element layer.

The light emitting element layer is formed on top of the overcoat layer OC and includes the light emitting elements LD. The light emitting element LD includes the anode electrode AE, the light emitting layer EML, and the cathode electrode CE.

At least one of the anode electrode AE and the cathode electrode CE may be a transmissive electrode, and at least the other one may be a reflective electrode. For example, in a case where the light emitting element LD is a type of rear-surface light emitting, the anode electrode AE may be a transmissive electrode, and the cathode electrode CE may be a reflective electrode. In contrast, in a case where the light emitting element LD is a type of front-surface light emitting, the anode electrode AE may be a reflective electrode, and the cathode electrode CE may be a transmissive electrode. In another embodiment, in a case where the light emitting element LD is a type of double-surface light emitting, both the anode electrode AE and the cathode electrode CE may be transmissive electrodes. A detailed configuration of the light emitting element LD will be described below, taking as an example the case where the light emitting element LD is a type of rear-surface light emitting.

The anode electrode AE is formed on top of the overcoat layer OC. The anode electrode AE is electrically connected to the upper electrode UE of the storage capacitor Cst through the first via hole VIA1 passing through the overcoat layer OC and the passivation layer PAS. The anode electrode AE may be electrically connected to the second drain electrode DE2 of the drive transistor DT by way of the storage capacitor Cst. When the first via hole VIA1, as described, is formed in such a manner as to be brought into contact with the upper electrode UE of the storage capacitor Cst, which has a relatively greater area than other electrodes, the influence due to a height difference in the vicinity of the first via hole VIA1 can be reduced.

The anode electrode AE may be formed of a transparent conductive material, such as indium tin oxide (ITO) or zinc oxide (ZnO). In a case where the anode electrode AE is a reflective electrode, the anode electrode AE may include a reflective layer. The reflective layer may be formed of aluminum (Al), copper (Cu), silver (Ag), nickel (Ni), or an alloy of these. In an embodiment, the reflective layer may be formed of APC (a silver/palladium/copper alloy).

In the non-light-emitting region NEA, the bank layer BNK is formed on top of the anode electrode AE. However, the light emitting layer EML is formed on top of the anode electrode AE in the light emitting region EA in a manner that is brought into direct contact with the anode electrode AE. That is, the bank layer BNK has a half-bank structure that covers the non-light-emitting region NEA and does not cover the light emitting region EA.

For example, with a structure where the bank layer BNK is arranged in all regions of the substrate SUB, which include the light emitting region EA and the non-light-emitting region NEA, the manufacturing cost is increased, and an opening ratio of the entire display panel 50 is reduced. In contrast, with a full bank-less structure, a color mixture phenomenon may occur where in the light emitting region EA, lights of different colors that are output from one pixel PX and one other adjacent pixel PX, respectively, are output in a mixed manner. Therefore, according to the present disclosure, the half-bank structure is employed where the bank layer BNK covers the non-light-emitting region NEA, but does not cover the light emitting region EA.

Specifically, the bank layer BNK is not arranged in a pixel column direction in the light emitting region EA where a plurality of pixels PXs are arranged in a line. However, the bank layer BNK is arranged in a pixel column direction in the non-light-emitting region NEA, positioned underneath the light emitting region EA, where the circuit element layer is arranged. Subsequently, the bank layer BNK is not arranged in the pixel column direction in the light emitting region EA positioned underneath the non-light-emitting region NEA. However, the bank layer BNK is arranged in the pixel column direction in the non-light-emitting region NEA, positioned underneath the light emitting region EA, where the circuit element layer is arranged. As a result, the bank layer BNK is realized in a stripe pattern on the display device 1.

In an embodiment, a region that is not covered by the bank layer BNK may be the light emitting region EA. In the non-light-emitting region NEA, the bank layer BNK may cover respective exposed regions of the anode electrode AE and the overcoat layer OC. In this embodiment, the first via hole VIA1 formed in the non-light-emitting region NEA is filled with the bank layer BNK.

The bank layer BNK may contain an organic material, such as a benzocyclobutene (BCB)-based material or a polyimide (Pi)-based material. In an embodiment, the bank layer BNK may be formed of a photosensitive material containing a black pigment. In this case, the bank layer BNK may play a role of a light blocking member (or a black matrix).

The light emitting layer EML is widely formed in the light emitting region EA and the non-light-emitting region NEA. In the light emitting region EA, the light emitting layer EML is formed in such a manner as to cover the anode electrode. In the non-light-emitting region NEA, the light emitting layer EML is formed on top of the bank layer BNK. In an embodiment, the light emitting layer EML may have a multi-layered thin film structure including a light generation layer. In this case, colors of lights generated in the light generation layer may be white, red, blue, green, and the like, respectively. However, the lights are not limited to these colors.

The light generation layer, for example, may include a hole transport layer (HTL), an organic light emitting layer, and an electron transport layer (ETL). The hole transport layer plays a role in smoothly transporting an hole injected from the anode electrode AE to the organic light emitting layer. The organic light emitting layer may be formed of an organic material containing a phosphor or fluorescent material. The electron transport layer plays a role in smoothly transporting an electron injected from the cathode electrode CE to the organic light emitting layer. In addition to the hole transport layer, the organic light emitting layer, and the electron transport layer, the light emitting layer EML may further include a hole injection layer (HIL), a hole blocking layer (HBL), an electron injection layer (EIL), and an electron blocking layer (EBL).

The light emitting layer EML may be formed to have a two-or-more stack tandem structure. In this case, each of the stacks may include the hole transport layer, the organic light emitting layer, and the electron transport layer. In a case where the light emitting layer EML is formed to have the two-or-more stack tandem structure, an electric potential generation layer may be formed between the stacks. The electric potential generation layer may include an n-type electric potential generation layer and a p-type electric potential generation layer. The n-type electric potential generation layer is positioned adjacent to a lower stack. The p-type electric potential generation layer is formed on top of the n-type electric potential generation layer in such a manner as to be positioned adjacent to an upper stack. The n-type electric potential generation layer injects an electron into the lower stack, and the p-type electric potential generation layer injects a hole into the upper stack. The n-type electric potential generation layer may be an organic layer resulting from doping an organic host material, capable of transporting an electron, with an alkali metal, such as lithium (Li), natrium (Na), kalium (K), or cesium (Cs), or an alkali earth metal, such as magnesium (Mg), strontium (Sr), barium (Ba), or radium (Ra). The p-type electric potential generation layer may be an organic layer resulting from doping an organic host material, capable of transporting an electron, with dopants.

The cathode electrode CE is formed on top of the light emitting layer EML. The cathode electrode CE may be widely formed in the light emitting region EA and the non-light-emitting region NEA.

The cathode electrode CE may be formed of a transparent conductive material (TCO) capable of transmitting light or may be formed of a semi-transmissive conductive material, such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy of these. In a case where the cathode electrode CE is formed of a semi-transmissive conductive material, light output efficiency can be increased by a micro cavity.

With reference to FIG. 4, together with FIGS. 3A and 3B, according to the present embodiment, at least one region of the anode electrode AE extends up to the non-light-emitting region NEA in order for the anode electrode AE to be brought into contact with the circuit element. A light-escaping phenomenon in the non-light-emitting region NEA can be blocked from occurring because the bank layer BNK covers an entire area of the anode electrode AE in the non-light-emitting region NEA.

In the present embodiment, a light absorption layer LA is further included between the light the passivation layer PAS and the overcoat layer OC. The light absorption layer LA may include a colorant, such as a pigment or a dye, that selectively transmits incident light in substantially only one portion of a wavelength band by transmitting light in a specific wavelength band and blocking light in other one specific wavelength band. In order to absorb light generated in the light emitting element LD, the light absorption layer LA may have a structure where at least two pigment layers are stacked on top of each other. For example, the light absorption layer LA may include a first absorption layer and a second absorption layer. The first absorption layer contains a pigment of a first color. The second absorption layer contains a pigment of a second color different from the first color. In an embodiment, the first color may be a red color, and a second color may be a blue color. However, the first and second absorption layers are not limited to these colors. When the absorption layers, which contain pigments of different colors as described above, overlap, the light-escaping phenomenon (for example, a black color visibility effect) can be effectively blocked by the reflection visibility effect from occurring.

The light absorption layer LA as described above may be formed of the same material as the color filter and may be formed by the same process as the color filter. That is, the color filter and the light absorption layer LA that have pigments of the same color may be formed together through a one-time masking process. For example, when the color filter containing the pigment of the first color is formed, the first absorption layer of the light absorption layer LA may be formed together, and when the color filter containing the pigment of the second color is formed, the second absorption layer of the light absorption layer LA may be formed together. Therefore, according to the present embodiment, the light-escaping phenomenon in the non-light-emitting region NEA can be more completely blocked from occurring without requiring a separate additional process for generating the light absorption layer LA.

The light absorption layer LA may be formed in the entire non-light-emitting region NEA. However, the present embodiment is not limited to this position. The light absorption layer LA may be formed on top of the anode electrode AE within the non-light-emitting region NEA, depending on how the present embodiment is implemented. In an embodiment, in a case where a pixel PX displays a white color, the light absorption layer LA may not be formed in the corresponding pixel PA.

When the light absorption layer LA is formed in the entire non-light-emitting region NEA, the first via hole VIA1 and the second via hole VIA2 may be formed in such a manner as to pass through the light absorption layer LA. In addition, the light absorption layer LA may be configured in such a manner as not to be formed in the vicinity of each of the first via hole VIA1 and the second via hole VIA2.

Figure 5:
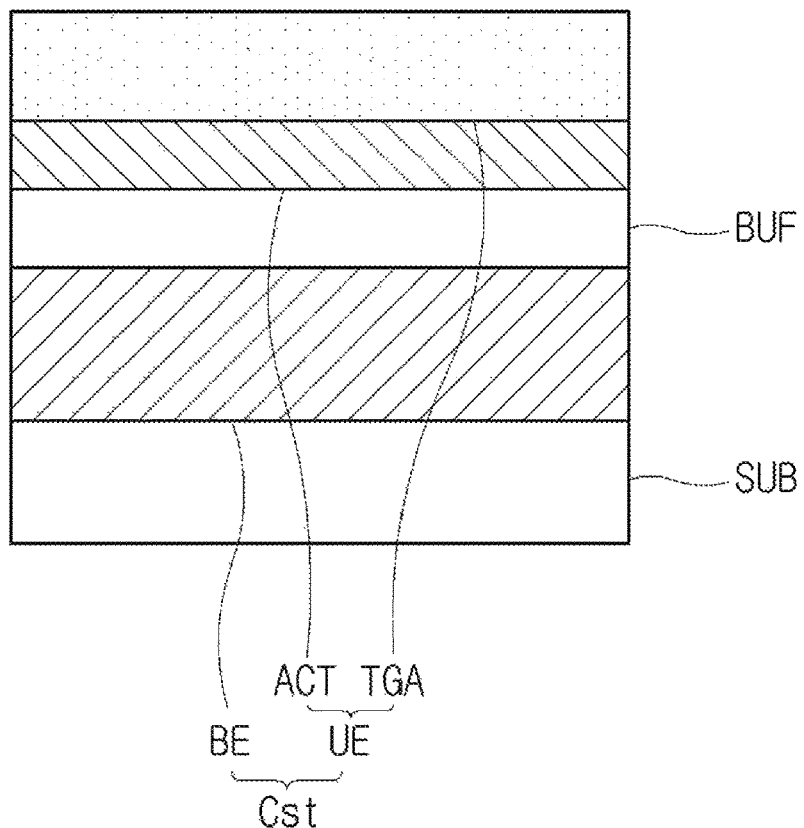
FIG. 5 is a cross-sectional view illustrating a storage capacitor according to another embodiment.

FIG. 5 is a cross-sectional view illustrating a storage capacitor according to another embodiment.

As described with reference to FIG. 4, together with FIGS. 3A and 3B, in an embodiment, the storage capacitor Cst may be configured with the lower electrode BE formed on the first conductive layer and the upper electrode UE formed on the second conductive layer. The buffer layer BUF and the gate insulating layer GI are interposed between the lower electrode BE and the upper electrode UE.

When the two insulating layers are interposed between the lower electrode BE and the upper electrode, a distance between the upper and lower electrodes BE and UE are relatively remotely positioned, and thus the capacity of the storage capacitor Cst can be decreased. Respective areas of the lower electrode BE and the upper electrode UE need to be increased in order to secure a selected capacity. However, the more increased the area of the storage capacitor Cst, the more increased the size of the pixel PX. Thus, a high-resolution display device is difficult to realize. Furthermore, in the case of the pixel PX displaying a white color, the opening ratio is difficult to secure.

In order to solve these problems, in an embodiment, the upper electrode UE of the storage capacitor Cst may have a multi-layered structure where the active layer ACT and the second conductive layer TGA overlap. In this case, the buffer layer BUF is interposed between the lower electrode BE and the upper electrode UE.

When compared with an embodiment illustrated in FIG. 4, in an embodiment illustrated in FIG. 5, only one insulating layer is interposed between the lower electrode BE of the storage capacitor Cst and the upper electrode UE, and thus the distance between the electrodes is relatively decreased. Accordingly, the capacity of the storage capacitor Cst can be improved. Thus, the area of the storage capacitor Cst can be prevented from being increased. As a result, the size of the pixel PX can be greatly decreased, and the opening ratio can be secured.

Figure 6A:
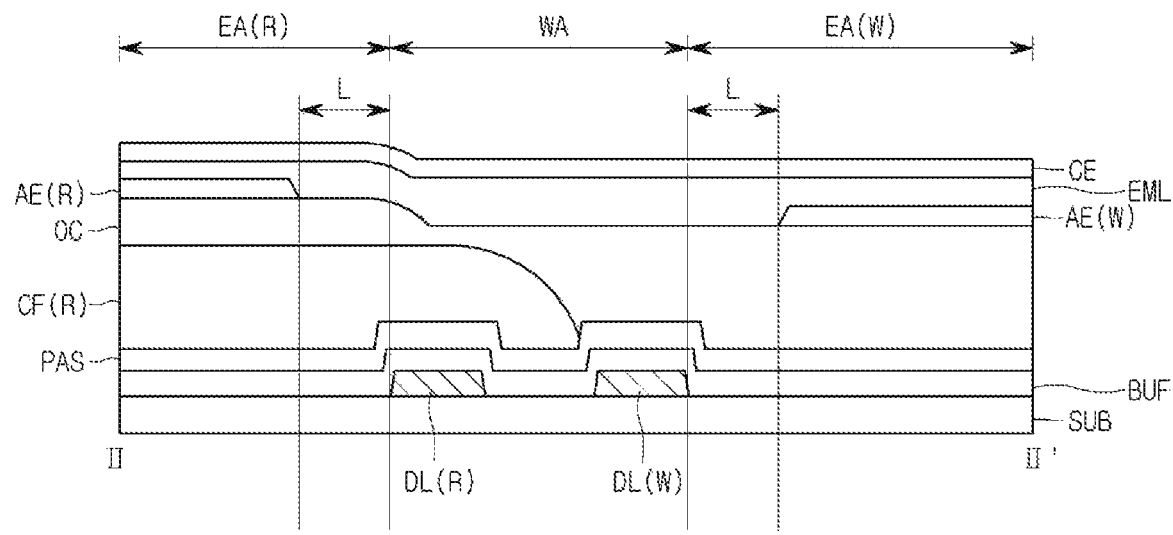
FIGS. 6A to 6C are cross-sectional views illustrating line II-II', line III-III', and line IV-IV' on FIG. 3A.
Figure 6B:
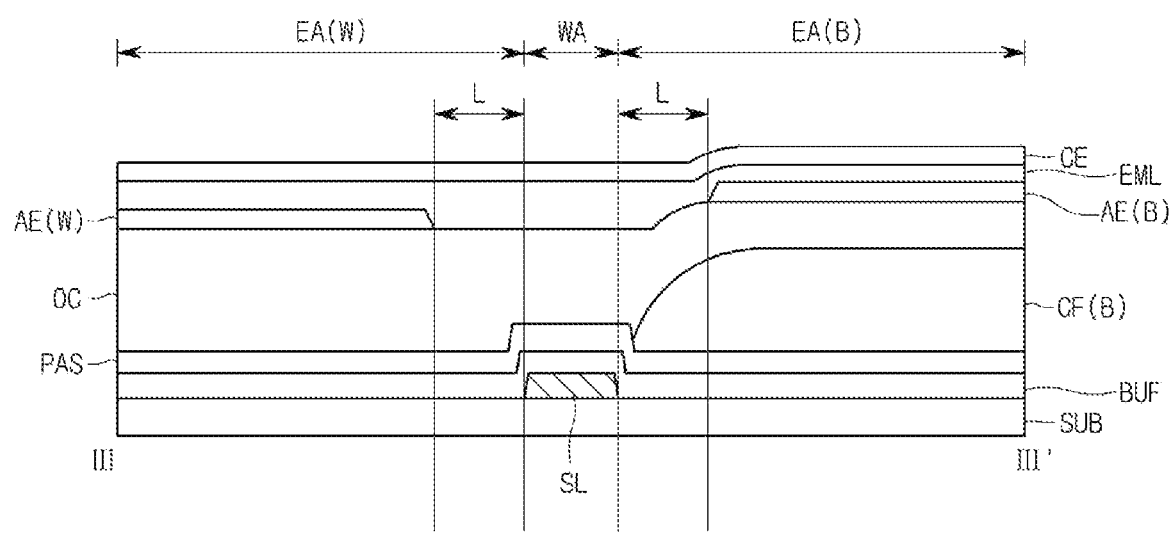
Figure 6C:
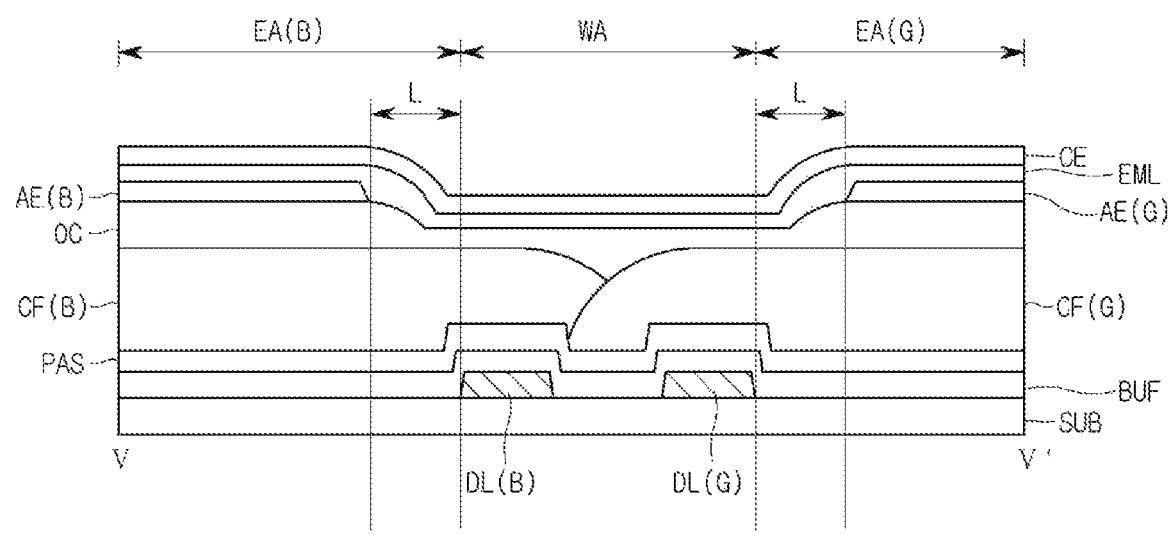

FIGS. 6A to 6C are cross-sectional views each illustrating a pixel according to an embodiment. Specifically, FIGS. 6A to 6C are cross-sectional views taken along line line and line IV-IV', respectively, on FIG. 3A.

With reference to FIGS. 3A, 3B, and 4, in order to display a color associated with a pixel, lights generated in the light emitting element LD may be emitted to the outside of the display panel 50 by way of respective color filters. However, in an pixel region having a structure in the related art, light may be reflected by the cathode electrode CA overlapping the bank layer BNK, and thus the phenomenon where light escapes into an adjacent pixel region may occur.

This light-escaping phenomenon occurs by many events occurring during a process of manufacturing the display panel 50. In an embodiment, the light-escaping phenomenon may occur when in a pixel displaying one of red, blue, and green colors, a pigment of a color filter is positioned more inward in the direction of the pixel than at a normal position, when the overcoat layer OC is formed to have a thickness greater than a normal thickness, or when the bank layer BNK is positioned more outward in the direction of the pixel than at a normal position.

An event that occurs when the color filter, the overcoat layer OC, and the bank layer BNK are stacked on top of each other is described above, and the present embodiment is not limited to this event.

In order to improve the light-escaping phenomenon and the color mixture phenomenon in the pixel region, in an embodiment, pixels displaying red, white, blue, and green colors may have structures as illustrated in FIGS. 6A to 6C, respectively.

Specifically, with respect to FIGS. 6A to 6C, the overcoat layers OC are widely formed in such a manner as to cover pigments of the color filters CF displaying red, blue, and green colors in the light emitting regions EA, respectively. The bank layer BNK is removed from the light emitting region EA of the pixel, when compared with the non-light-emitting region NEA in FIG. 4.

In an embodiment, in the light emitting region EA, the overcoat OC is formed to have a thickness varying with the color filter CF. The overcoat layer OC in the region where the color filter CF is not arranged is formed to have a greater thickness than the overcoat layer OC in the region where the color filter CF is arranged between the overcoat layer OC and the passivation layer PAS.

After the overcoat OC is formed, the anode electrode AE may be patterned. The anode electrode AE of each pixel is formed on top of the overcoat layer OC in each of the pixel regions displaying red, white, blue, and green colors, respectively. The color filter displaying each color and the anode electrode AE may be arranged in an overlapping manner, with the overcoat layer OC in between, in each of regions of a red pixel R, a blue pixel B, and a green pixel G except for a white pixel W among pixels.

According to the present embodiment, the anode electrode AE is arranged in such a manner as not to overlap the data line DL or the sensing line SL that is arranged along an edge of the light emitting region EA. With a structure in the related art where the data line DL or the sensing line SL overlaps the anode electrode AE, electric current is consumed in a region where the anode electrode AE overlaps the data line DL or the sensing line SL, but this region may not be utilized as the light emitting region EA. Thus, the entire light efficiency is decreased.

In order to increase the light efficiency of this light emitting region EA, according to the present embodiment, the anode electrode AE is arranged in such a manner as not to overlap the data line DL arranged along the edge of the light emitting region EA. In an embodiment, the anode electrodes AE of the red pixel R, the white pixel W, the blue pixel B, and the green pixel G may be arranged to be positioned the same distance L apart from the adjacent data line DL or sensing line SL in such a manner as not to overlap the adjacent data line DL or sensing line SL.

After the anode electrode AE is formed, the light emitting layer EML and the cathode electrode CE are sequentially stacked on top of each other. The light emitting layer EML and the cathode electrode CE may be widely formed on top of the display panel 50.

The light emitting layer EML may have the multi-layered thin film structure that includes the light generation layer. In this case, colors of lights generated in the light generation layer may be white, red, blue, green, and the like. However, the lights are not limited to these colors.

The cathode electrode CE may be widely on top of the display panel 50. In an embodiment, the light emitting layer EML may be formed using an evaporation deposition method. In addition, the cathode electrode CE may be formed using a physics vapor deposition method, such as sputtering. However, the present embodiment is not limited to these methods.

With reference to FIG. 6A, light emitted from the light emitting electrode LD of the red pixel R may be reflected by the cathode electrode CE, and thus may propagate toward a lower portion of the display panel 50. Due to a curved edge of the light emitting region EA, which results from a change in a thickness of the overcoat layer OC, the reflected light may be blocked from being emitted toward the adjacent white pixel W.

With reference to FIG. 6B, light emitted from the light emitting element LD of the white pixel W may be reflected by the cathode electrode CE, and thus may propagate toward the lower portion of the display panel 50. Due to the curved edge of the light emitting region EA, which results from the change in the thickness of the overcoat layer OC, the reflected light may be blocked from being emitted toward the adjacent white blue pixel B.

With reference to FIG. 6C, light emitted from the light emitting element LD of the white pixel B may be reflected by the cathode electrode CE, and thus may propagate toward the lower portion of the display panel 50. Due to the curved edge of the light emitting region EA, which results from the change in the thickness of the overcoat layer OC, the reflected light may be blocked from being emitted toward the adjacent green pixel G.

As described above, in the display panel 50 according to an embodiment, the phenomenon where light escapes into an adjacent pixel region can be improved by deleting the bank layer BNK in the light emitting region EA can be improved. At the same time, the entire light efficiency can be increased by arranging the anode electrode AE of a pixel in such a manner as not to overlap the data line DL or the sensing line SL.

Figure 7:
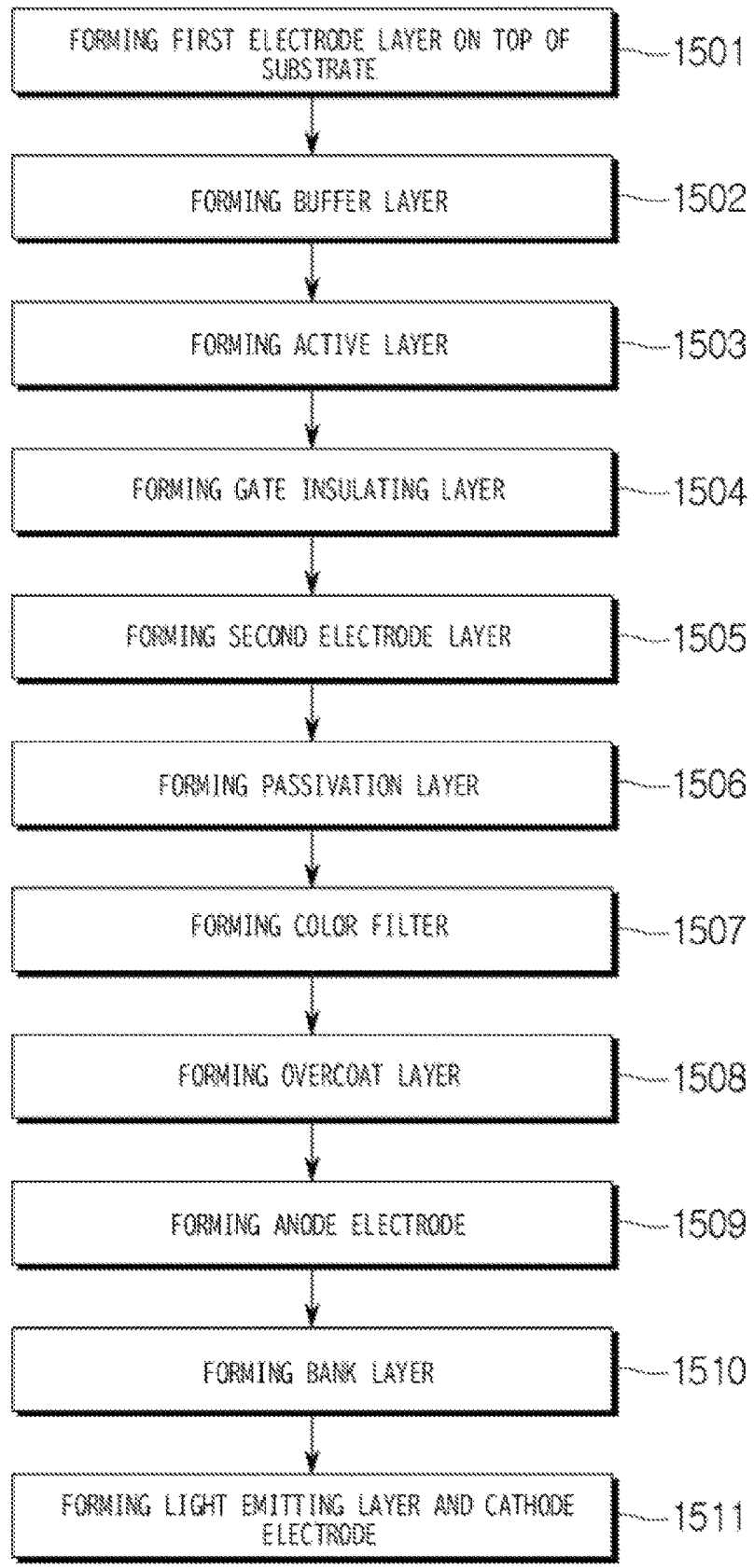
FIG. 7 is a flowchart illustrating a method of manufacturing the display device according to an embodiment.

FIG. 7 is a flowchart illustrating a method of manufacturing the display device according to an embodiment. Specifically, FIG. 7 illustrates a method of manufacturing the display panel 50 having the pixel PXij described with reference to FIGS. 4 and 5.

With reference to FIG. 7, together with FIGS. 3A, 3B, and 4, first, the circuit element layer may be formed on top of the substrate SUB. Specifically, the first conductive layer may be formed on top of the substrate SUB (1501). A conductive film is formed on top of the substrate SUB using a printing process, a sputtering process, a chemical vapor deposition process, a pulse laser deposition (PLD) process, a vacuum deposition process, an atomic layer deposition process, and the like. Then, the first conductive layer may be formed by patterning the conductive film through an etching process using a mask. At this point, the first mask may be used.

Subsequently, the buffer lay BUF may be formed on top of the first conductive lay (1502). The buffer layer BUF may be formed through a chemical vapor deposition process, a spin coating process, a plasma-enhanced chemical vapor deposition process, a sputtering process, a vacuum deposition process, a high density plasma-chemical vapor deposition process, a printing process, and the like.

The active layer ACT may be formed on top of the buffer layer BUF (1503). For example, an amorphous silicon layer may be formed on top of the buffer layer BUF, the amorphous silicon layer may be crystallized, and thus a polysilicon layer may be formed. Subsequently, the active layer ACT may be formed by patterning the polysilicon layer using a photolithography method or the like. At this point, the second mask for a photolithography process may be used. The polysilicon layer constituting the active layer ACT may be doped with impurities, and thus the source regions SA1, SA2, and SA3, the drain regions DA1, DA2, and DA3, and the channels CH1, CH2, and CH3 may be formed. Contact holes for contacting to the first conductive layer and the upper layer may be further formed in the buffer layer BUF.

The gate insulating layer GI may be formed on top of the active layer ACT (1504). The gate insulating layer GI may be selectively formed in a region where the second conductive layer described below is to be formed. Specifically, the gate insulating layer GI may be formed using the photolithography method or the like for exposing and developing the gate insulating layer GI using a mask. At this point, the third mask may be used.

The second conductive layer may be formed on top of the gate insulating layer GI (1505). A conductive film is formed on top of the gate insulation GI using the printing process, the sputtering process, the chemical vapor deposition process, the pulse laser deposition (PLD) process, the vacuum deposition process, the atomic layer deposition process, and the like. Then, the second conductive layer may be generated by patterning the conductive film through the etching process using a mask. At this point, the fourth mask may be used.

Subsequently, the passivation layer PAS may be formed in such a manner as to cover the second conductive layer (1506). The color filter may be formed on top of the passivation layer PAS (1507). Regarding a color filter, for example, a color filter of a first color may be patterned using a first mask, a color filter of a second color may be patterned using a second mask, and a color filter of a third color may be patterned using a third mask. While the color filter is formed, the light absorption layer LA may be formed together. In order to form the color filter and the light absorption layer LA, three masks that correspond to the first to third colors, respectively, that is, the fifth to seventh masks may be used.

Subsequently, the overcoat layer OC may be formed in such a manner as to cover the color filter and the light absorption layer LA (1508). The overcoat layer OC may be exposed and developed on the passivation layer PAS using the mask. The mask may include openings that correspond to the via holes VIA1 and VIA2, respectively. At this point, the eighth mask may be used.

The light emitting element may be formed on top of the overcoat layer OC. Specifically, the anode electrode AE is patterned on the overcoat layer OC, using the ninth mask having openings that correspond to the light emitting regions EA, respectively (1509).

After the anode electrode AE is formed, the bank layer BNK is widely formed on tops of the anode electrode AE and the exposed overcoat layer OC in such a manner as to cover the non-light-emitting region NEA (1510). The via holes VIA1 and VIA2 formed in the non-light-emitting region NEA may be filled with the bank layer BNK. After the bank layer BNK is formed, the light emitting layer EML and the cathode electrode CE are widely formed in such a manner as to cover an entire area of the display panel 50 (1511).

According to the present disclosure, the half-bank structure is employed in which the bank layer BNK covers the non-light-emitting region NEA, but does not cover the light emitting region EA. That is, the bank layer BNK is not arranged in the pixel column direction in the light emitting region EA where a plurality of pixels PXs are arranged in a line. However, the bank layer BNK is arranged in the pixel column direction in the non-light-emitting region NEA, positioned underneath the light emitting region EA, where the circuit element layer is arranged. Subsequently, the bank layer BNK is not arranged in the pixel column direction in the light emitting region EA positioned underneath the non-light-emitting region NEA. However, the bank layer BNK is arranged in the pixel column direction in the non-light-emitting region NEA, positioned underneath the light emitting region EA, where the circuit element layer is arranged. As a result, the bank layer BNK is realized in a stripe pattern on the display device 1.

Although the specific embodiment of the present disclosure has been described for illustrative purposes, those skilled in the art will appreciate that various modifications, additions and substitutions are possible, without departing from the scope and spirit of the disclosure as disclosed in the accompanying claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
   a substrate including:
   a light emitting region; and
   a non-light-emitting region adjacent to the light emitting region;
   a storage capacitor formed in the non-light-emitting region on the substrate and having an upper electrode and a lower electrode;
   a light absorption layer formed on the storage capacitor;
   an anode electrode formed on the light absorption layer;
   a first via hole formed in such a manner as to pass through the light absorption layer; and
   a bank layer formed on the light absorption covering a top of the storage capacitor,
   an overcoat layer formed of an organic material and formed between the light absorption layer and the bank layer and in the first via hole;
   wherein the bank layer is not formed in the light emitting region, and
   wherein the anode electrode is in direct contact with the upper electrode of the storage capacitor through the first via hole and the overcoat layer, and
   wherein the light absorption layer includes a colorant capable of selectively transmitting incident light in substantially only one portion of a wavelength band by transmitting light in a first wavelength band and blocking light in a second wavelength band,
   wherein the light absorption layer has a structure of at least a first absorption layer contains a pigment of a first color and a second absorption layer contains a pigment of a second color different from the first color stacked on top of each other.

2. The display device of claim 1, further comprising:
   a first conductive layer including the lower electrode of the storage capacitor and arranged on top of the substrate;
   a buffer layer covering the first conductive layer;
   an active layer arranged on top of the buffer layer;

a gate insulating layer covering the active layer; and
a second conductive layer including the upper electrode of the storage capacitor and being arranged on top of the gate insulating layer and including at least one electrode of a transistor.

3. The display device of claim 2, further comprising:
a passivation layer arranged on top of the gate insulating layer; and
an overcoat layer arranged on top of the passivation layer,
wherein the passivation layer and the overcoat layer are formed on all regions of the substrate, the all regions including the light emitting region and the non-light-emitting region.

4. The display device of claim 3, further comprising:
a light emitting layer arranged on top of the anode electrode; and
a cathode electrode arranged on top of the light emitting layer,
wherein the anode electrode is arranged on top of the overcoat layer, and
wherein the bank layer is interposed between the anode electrode and the light emitting layer.

5. The display device of claim 4, further comprising:
a data line and a sensing line that extend in a direction of pixels arranged in columns, the pixels, in operation, displaying a white, red, green, or blue color,
wherein the data line or the sensing line is arranged between the columns in which the pixels are arranged.

6. The display device of claim 5, wherein the anode electrode does not overlap the data line or the sensing line.

7. The display device of claim 3, further comprising:
a color filter having the red, green, or blue color,
wherein the color filter is arranged in the light emitting region and is interposed between the passivation layer and the overcoat layer.

8. The display device of claim 2, wherein the at least one transistor includes a drive transistor configured to control an amount of electric current flowing to the anode electrode, and
wherein the drive transistor comprises:
a source electrode being arranged on the second conductive layer and being electrically connected to a power line;
a gate electrode being included in the second conductive layer and being electrically connected to the lower electrode of the storage capacitor; and
a drain electrode being arranged on the second conductive layer and being electrically connected to the upper electrode of the storage capacitor.

9. The display device of claim 8, wherein the passivation layer is interposed between the lower electrode of the storage capacitor and the upper electrode thereof.

10. The display device of claim 1, where the bank layer is realized in a stripe pattern in the display device.

11. The display device of claim 1, further comprising:
wherein the overcoat layer is disposed between the anode electrode and the sidewall of the first via hole in the first via hole.

12. The display device of claim 8, wherein the upper electrode of the storage capacitor is included in the second conductive layer, and
the gate electrode and the upper electrode of the storage capacitor are disposed on a same layer.

* * * * *